United States Patent
Den Ouden

(10) Patent No.: US 8,451,968 B2
(45) Date of Patent: May 28, 2013

(54) PHASE-COUPLED CLOCK SIGNAL GENERATOR AND CHARACTER GENERATOR COMPRISING SUCH A PHASE-COUPLED CLOCK SIGNAL GENERATOR

(75) Inventor: Josephus A. A. Den Ouden, Eindhoven (NL)

(73) Assignee: Entropic Communications, Inc., San Diego, CA (US)

( * ) Notice: Subject to any disclaimer, the term of this patent is extended or adjusted under 35 U.S.C. 154(b) by 318 days.

(21) Appl. No.: 10/211,895

(22) Filed: Aug. 2, 2002

(65) Prior Publication Data

US 2002/0196888 A1 Dec. 26, 2002

Related U.S. Application Data

(63) Continuation of application No. 08/397,021, filed on Mar. 1, 1995, now Pat. No. 6,456,679.

(51) Int. Cl.
*H04L 7/00* (2006.01)
(52) U.S. Cl.
USPC .......................................... 375/355; 375/373
(58) Field of Classification Search
USPC .............. 375/354, 355, 371, 373; 331/177 U, 331/177; 327/134, 155, 156, 151, 142, 160; 333/12, 173; 348/500, 536; 328/134, 155
See application file for complete search history.

(56) References Cited

U.S. PATENT DOCUMENTS

| 4,103,251 A | | 7/1978 | Glick | |
|---|---|---|---|---|
| 4,376,291 A | * | 3/1983 | Heitmann | 386/2 |
| 4,672,449 A | * | 6/1987 | Kraus et al. | 348/511 |
| 4,723,114 A | | 2/1988 | D'Arrigo et al. | |
| 4,754,163 A | * | 6/1988 | Aue et al. | 327/114 |
| 4,996,596 A | * | 2/1991 | Hirao et al. | 348/542 |
| 5,070,517 A | * | 12/1991 | Kochler et al. | 375/369 |
| 5,649,124 A | * | 7/1997 | Kreidl | 710/305 |

FOREIGN PATENT DOCUMENTS

| DE | 3446227 A1 | 6/1986 |
|---|---|---|
| EP | 0076009 A1 | 4/1983 |
| EP | 0103982 A2 | 3/1984 |
| EP | 0235441 A2 | 9/1987 |
| JP | 51111318 A | 10/1976 |

OTHER PUBLICATIONS

Helmut Sterl et al., "Mikrorechnergesteuertes fernsehkompatibles Datensichtgerat", radio fernsehen elektronik, vol. 28, No. 4, 1979, pp. 235-240.
European Search Report for EP application No. EP 90 20 3285, searched Apr. 16, 1991.

* cited by examiner

*Primary Examiner* — Tesfaldet Bocure
(74) *Attorney, Agent, or Firm* — Bruce Greenhaus; Richard Bachand; Duane Morris LLP

(57) ABSTRACT

A phase-coupled clock signal generator comprises a start-stop oscillator (1) to which a control signal is applied. The clock frequency is dependent on an adjusting value (F). For adjusting and monitoring the clock frequency, the clock signal generator is provided with a counter (2). This counter counts the number of received clock pulses during a predetermined period and generates a corresponding counting value (C). A control circuit (3) compares the counting value (C) with a reference value and adapts the adjusting value (F). Such a clock signal generator is suitable for On Screen Display applications in a television receiver.

5 Claims, 6 Drawing Sheets

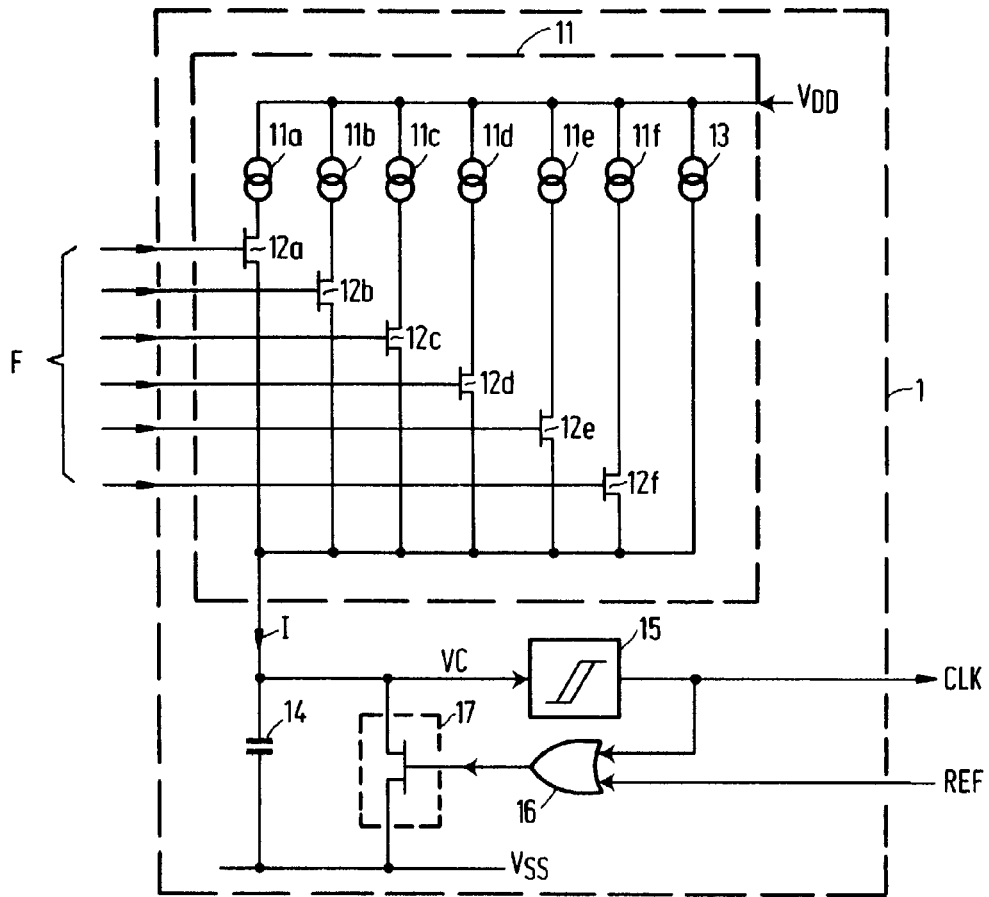
FIG.3
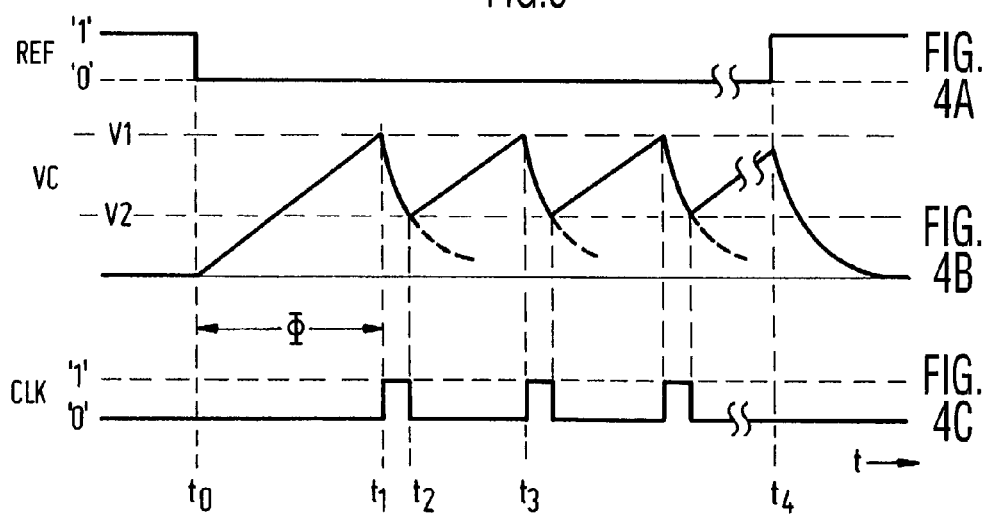
FIG. 4A
FIG. 4B
FIG. 4C

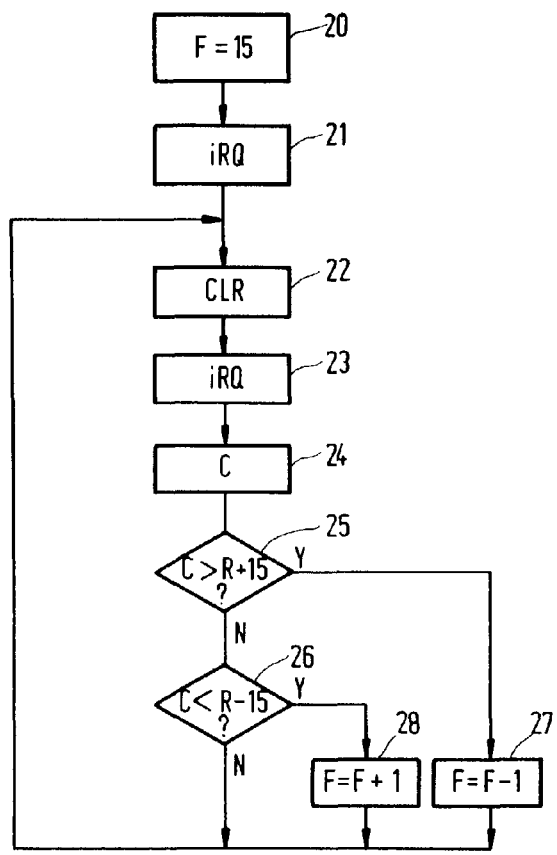
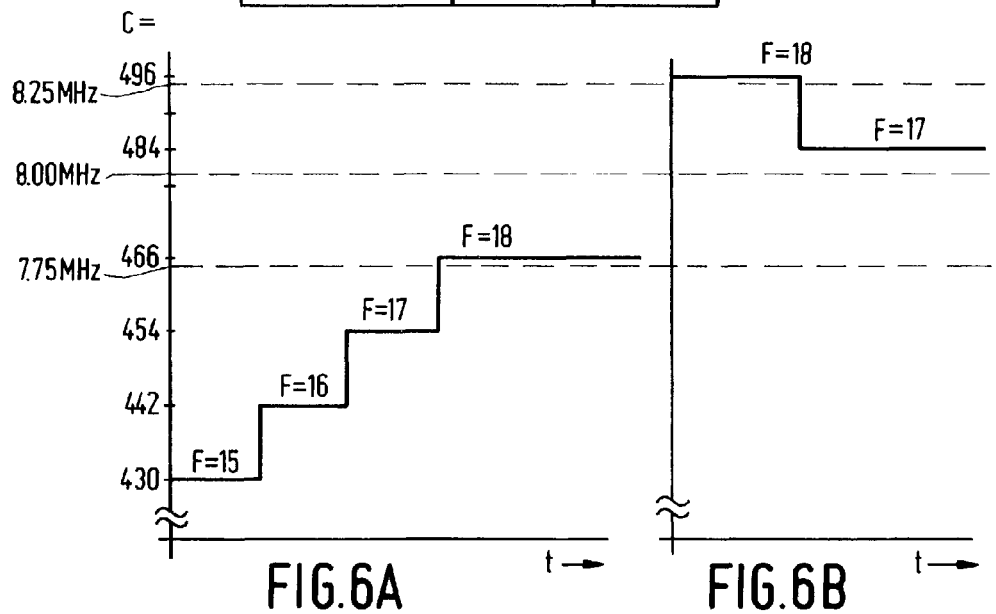
FIG. 5
FIG. 6A  FIG. 6B

PHASE-COUPLED CLOCK SIGNAL GENERATOR AND CHARACTER GENERATOR COMPRISING SUCH A PHASE-COUPLED CLOCK SIGNAL GENERATOR

CROSS REFERENCE TO RELATED APPLICATION

This is a continuing application of U.S. patent application Ser. No. 08/397,021 filed on Mar. 1, 1995 now U.S. Pat. No. 6,456,679.

FIELD OF THE INVENTION

The invention relates to a phase-coupled clock signal generator comprising a start-stop oscillator having an input for receiving a control signal to allow oscillation in response to a first value of the control signal and no oscillation in response to a second value of the control signal. The invention also relates to a character generator for generating characters on a display screen, which generator comprises such a clock signal generator.

DESCRIPTION OF THE PRIOR ART

A Phase Locked Loop (PLL) is often used for generating a clock signal. Such a PLL generates a continuous clock signal which is coupled in phase and frequency to an applied periodical reference signal. Phase coupling of a clock signal to a reference signal, which will further be referred to as control signal, is also achieved by means of a start-stop oscillator. Such a start-stop oscillator is described in British Patent Specification GB 1,276,025. The start-stop oscillator oscillates at a predetermined frequency when the first value of the control signal is being applied and does not oscillate in response to the second value of the control signal. Consequently, the clock signal generated by the start-stop oscillator is discontinuous. The phase coupling is realised in that oscillation starts under the same conditions whenever the first value of the control signal occurs. The frequency is independent of the control signal and is only determined by the dimensioning of appropriate components.

In various applications of a clock signal generator only the phase coupling with the control signal is important. An accurate frequency coupling is then superfluous and the discontinuity in the clock signal is acceptable. In these cases the use of the start-stop oscillator is preferred to the PLL for economical reasons. An example of such an application is a character generator for displaying characters on a display screen. A line flyback signal is used as a control signal. A stable picture is obtained by the phase coupling of the clock signal to this line flyback signal. In a character generator the frequency of the clock signal determines the width of the characters and need not be accurate. It is sufficient for the frequency to have a value between two predetermined limits and to be further stable.

In practice it has been found difficult to realise the frequency-determining components of a start-stop oscillator in an integrated circuit (IC) within the required tolerance limits. The known clock signal generators therefore comprise external precision components or external adjustable components for adjusting the desired frequency. However, such components as well as the required connection pins on an IC raise the costprice of the clock signal generator. Moreover, adjusting the components is a time-consuming and costly activity.

SUMMARY OF THE INVENTION

It is one of the objects of the invention to provide a phase-coupled clock signal generator comprising a start-stop oscillator in which said drawbacks are obviated. To this end the clock signal generator according to the invention is characterized in that the start-stop oscillator is of a type whose generated frequency is adjustable by means of an applied adjusting value and in that the clock signal generator comprises control means for adapting the adjusting value in response to a difference between the generated frequency and a predetermined desired frequency. It is achieved with said control means that the desired frequency is obtained autonomously without any further adjustments, if the frequency range of the start-stop oscillator covers this desired frequency. Such a frequency range need not be accurately defined in itself. The only requirement imposed is that the desired frequency falls within this range. Critical components are not required for dimensioning such a frequency range. Consequently, components can be used with such a tolerance that they can be realised in an IC. This makes the pins for connecting the external components superfluous, thus also avoiding the problem that such pins, which convey signal variations with the generated frequency, generate electromagnetic radiation causing interference with other neighbouring circuits.

A start-stop oscillator of said type is described in Patent Application no. PHN 13.177 in the name of the Applicant and comprises a capacitor, a current source for charging the capacitor, in which the value of the current corresponds to the applied adjusting value, a discharge circuit for discharging the capacitor, a threshold circuit for switching on the discharge circuit in response to reaching a predetermined first voltage across the capacitor and for switching off the discharge circuit in response to a second voltage across the capacitor, and a stop circuit for switching on the discharge circuit in response to the second value of the applied control signal. Such an embodiment of the start-stop oscillator can be dimensioned in a conventional economical IC technology.

An embodiment of the clock signal generator according to the invention is characterized in that the control means are adapted to generate a counting value which corresponds to the generated frequency, to compare said counting value with a reference value which corresponds to the desired frequency, and to adapt the adjusting value in response to the difference between the counting value and the reference value. Such control means can be realised with simple digital components and integrated on an IC together with other circuits. This will be very much appreciated if it is considered that the phase-coupled clock signal generator can now be incorporated in an IC together with, for example a character generator.

A favourable embodiment of the clock signal generator, in which the control signal is periodical, is characterized in that the control means for generating the counting value comprise a counting circuit for counting clock pulses in the clock signal during the period when the first value of the control signal is available. Such an embodiment has the advantage that a defined periodical time interval required for generating the counting value is used without any additional provisions.

A further favourable embodiment of the clock signal generator according to the invention is characterized in that the control means are realised to adapt the adjusting value, if the difference between the counting value and the reference value is larger than a predetermined value. This results in the effect that the frequency, if gradually changing due to, for example, temperature effects, is not adapted until it has varied by more than a predetermined value. This will be very much appreciated when using the clock signal generator in a character generator in which a slow variation of the frequency, and hence of the character width, is acceptable. A steady and stable picture is obtained with said embodiment by correcting the frequency only after it has reached predetermined limits.

A further embodiment of the clock signal generator according to the invention is characterized in that the input of the start-stop oscillator for receiving the control signal is coupled to delay means for delaying the transition from the first to the second value of the control signal. This provides the effect that the oscillator reaches its non-oscillating state only with a predetermined delay upon the transition to the second value of the control signal. This is particularly sensible in applications of the clock signal generator in which the periodical discontinuity in the clock signal is acceptable, but must remain limited in time. For example, a character generator is enabled to perform tasks also during the line flyback period.

As previously stated, a clock signal generator according to the invention is eminently suitable for integration with, for example a character generator. Such a character generator comprises, inter alia, a horizontal position counter to which the clock signal is applied for positioning the characters in a picture line. An embodiment of the character generator according to the invention is characterized in that the horizontal position counter is constituted by the counting circuit of the clock signal generator. This limits the number of digital components and thus leads to a further saving of costs.

It has been found practical to implement the control means for comparing the counting value with the reference value and for adapting the adjusting value as a programmed logic circuit. It is notably sensible to accommodate the phase-coupled clock signal generator and a character generator for displaying so-called "On Screen Display" (OSD) pictures on the display screen of a television receiver in an IC, together with a microprocessor for controlling the television receiver, while the control means of the clock signal generator are constituted by said microprocessor.

BRIEF DESCRIPTION OF THE FIGURES

FIG. 3 shows an embodiment of the start-stop oscillator shown in FIG. 1.

FIG. 4 shows signal waveforms of some signals shown in FIG. 3.

FIG. 5 shows the flow chart of a control program for use in the clock signal generator shown in FIG. 1.

FIG. 6 shows a time diagram to explain the operation of the control program shown in FIG. 5.

DESCRIPTION OF EMBODIMENTS

Figure 1:
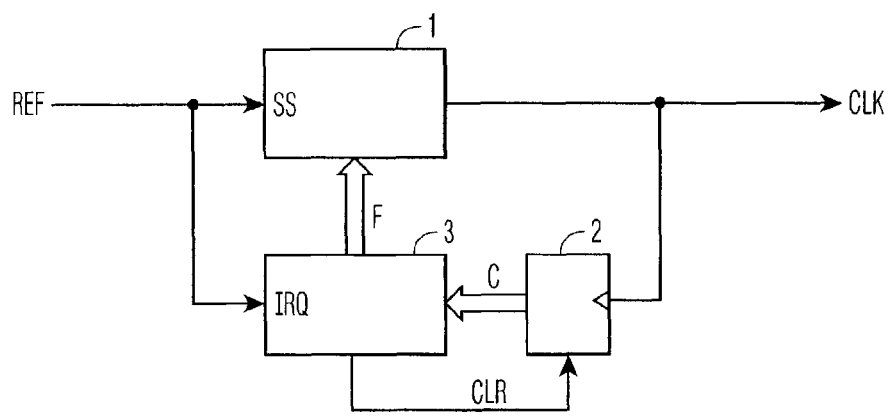
FIG. 1 shows diagrammatically the general structure of the phase-coupled clock signal generator according to the invention.
Figure 2A:
FIG. 2 shows signal waveforms of some signals shown in FIG. 1.
Figure 2B:
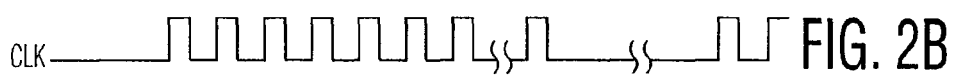
Figure 2C:
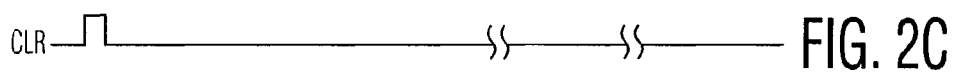
Figure 2D:
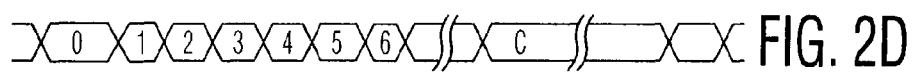

FIG. 1 shows diagrammatically the structure of a phase-coupled clock signal generator according to the invention. The clock signal generator comprises a start-stop oscillator 1 having a first input SS to which a periodical control signal REF is applied and a further input to which an adjusting value F is applied. The start-stop oscillator 1 supplies an output signal CLK which will be further referred to as clock signal. This clock signal is applied to a counter 2. The counter 2 generates a counting value C and applies it to a control circuit 3. The control circuit 3 is adapted to generate the adjusting value F in response to the received counting value C and a reference value R stored in the control circuit. The control circuit 3 further receives the control signal REF at an input IRQ and applies a reset signal CLR to the counter 2. In practice, the control circuit 3 may comprise a microprocessor, for example the type 84C640 of Philips. The input IRQ is then preferably a so-called "interrupt request" input.

To explain the clock signal generator shown in FIG. 1, FIG. 2 shows time diagrams of some signals shown in FIG. 1. It is assumed by way of example that the control signal REF is a line flyback signal as generated in a television receiver by a known deflection circuit. Such a line flyback signal is shown in FIG. 2A. It has, for example a frequency of 15,625 Hz and comprises a display period of 60 μsec with the logic value "0" and a flyback period of 4 μsec with the logic value "1". The clock signal CLK of the start-stop oscillator 1 is shown in FIG. 2B. It comprises a series of clock pulses at a frequency determined by the adjusting value F during the display period of the control signal REF and has a constant value during the flyback period of the control signal REF. The control circuit 3 generates the reset signal CLR shown in FIG. 2C during the flyback period. As a result, the counter 2 assumes a count 0. During the display period the count is raised by 1 at each clock pulse of the clock signal CLK. FIG. 2D shows a number of counts. After the display period has finished, the further supply of clock pulses to the counter 2 is discontinued. The count then reached is a counting value C which corresponds to the number of generated clock pulses during the display period of control signal REF. The counting value C is applied to the control circuit 3. This circuit is adapted, in a manner to be further described, to compare the counting value C with the reference value R and to adapt the adjusting value F, if necessary.

FIG. 3 shows an embodiment of a start-stop oscillator 1 for use in the clock signal generator of FIG. 1. A current source 11 generates a charge current I, whose value is determined by an applied 6-bit adjusting value F. To this end the current source 11 comprises a plurality of separate current sources 11a-11f which are switched by means of switching elements 12a-12f by a bit of the adjusting value F. Such current sources may be realised, for example, by means of transistors arranged as current mirrors whose mutual ratios of their emitter surfaces determine the value of the current. The current source 11 further comprises a current source 13 determining a minimum value of the charge current I. The current sources 11a-11f are preferably dimensioned in such a way that the current source I is linearly dependent on the applied adjusting value F. The charge current I is applied to a capacitor 14. A voltage VC which is applied to a bistable threshold circuit 15 is produced across this capacitor 14. Such a threshold circuit is generally known by the name of Schmitt trigger. The output of the threshold circuit 15 is coupled to a discharge circuit 17 via a first input of an OR gate 16. A second input of this OR gate receives the control signal REF.

FIG. 4 shows some time diagrams to explain the start-stop oscillator shown in FIG. 3. It will be provisionally assumed that the control signal REF shown in FIG. 4A has the logic value "1" (t<t0). The discharge circuit 17 is then activated by the output of OR gate 16 so that the charge current I flows through the discharge circuit 17 and the capacitor 14 is and remains discharged. The voltage VC shown in FIG. 4B is then zero and the output of the threshold circuit 15 (FIG. 4C) has the logic value "0". Subsequently it is assumed that the control signal REF has the logic value "0" (t0<t<t4). Both inputs of the OR gate 16 are now "0" and the discharge circuit 17 is no longer activated. The charge current I now flows through the capacitor 14 and generates a voltage VC increasing with time (t0<t<t1) across this capacitor. When a first threshold value (V1 in FIG. 4B) is reached, the output of the threshold circuit will acquire the logic value "1" and thereby activate the discharge circuit 17 via the OR gate 16. The capacitor 14 will now be discharged so that the voltage decreases (t1<t<t2). When a second, lower threshold value (V2 in FIG. 4B) is reached, the output of the threshold circuit acquires the logic value "0". As a result, the discharge circuit 17 is no longer activated so that the voltage across the capacitor will increase again (t2<t<t3). Said charging and discharging of the capacitor 14 is thus periodically maintained so that the clock signal CLK shown in FIG. 4C is produced at the output of the threshold circuit. Subsequently, the control signal REF assumes the logic value "1" again (t>t4) and capacitor 14 is discharged completely. Clock pulses are then no longer generated. The frequency of the clock signal, further referred to as clock frequency, is determined by the discharge time t1–t2 and the charge time t2–t3. The discharge time is substantially constant, whereas the charge time is dependent on the charge current I and hence on the adjusting value F. The clock frequency is thus adjusted by means of the adjusting value F. For F=0 the lowest frequency is generated, whereas for F=63 the frequency is maximum. At a constant adjusting value F the phase φ shown in FIG. 4 between clock signal and control signal is constant.

A start-stop oscillator as shown in FIG. 3 is very suitable for integration with, for example a character generator. It will hereinafter be assumed by way of example that the desired clock frequency for this purpose is nominally 8 MHz with a tolerance of ±250 kHz. The start-stop oscillator shown in FIG. 3 is then dimensioned for a frequency range of, for example 4 to 16 MHz so as to guarantee that at least one of the possible adjusting values F (F=0 . . . 63) corresponds to the desired frequency, even in the case of a large spread of the capacitance. In practice it appears that the generated clock frequency is substantially linearly dependent on the adjusting value F. The frequency difference corresponding to two successive adjusting values is approximately 200 kHz. However, an exact linearity is not important for the invention.

The control circuit 3 shown in FIG. 1 is preferably constituted by a microprocessor and is adapted to perform a control program. FIG. 5 shows the flow chart of such a control program. In a step 20 a predetermined initial value is assigned to the adjusting value F. In the embodiment the value F=15 has been taken for this purpose. In a step 21 the control program waits for an "interrupt request" occurring at the input IRQ (see FIG. 1) of the control circuit 3. This request indicates that there is a transition from the logic value "0" to the logic value "1" in the control signal. This transition marks the start of the flyback period. In a step 22 the control program generates the reset signal CLR at, for example a line of an output port. Subsequently, the control program waits in a step 23 for another interrupt request at the input IRQ. Meanwhile the counter 2 receives clock pulses at a clock frequency which is determined by the initial adjusting value F. At this adjusting value the start-stop oscillator generates a clock frequency which may considerably deviate from the desired 8 MHz due to tolerances. The counter 2 counts the number of clock pulses during the display period of the line flyback signal (60 μsec) and reaches the counting value C. In a step 24 this counting value C is read by the control program. A reference value R corresponding to the desired clock frequency of 8 MHz is stored in the control circuit 3. This reference value is R=480 (60 μsec*8 MHz). Since deviations of ±250 kHz (corresponding to ±15 clock pulses) are permitted, it is tested in a step 25 whether the counting value C is larger than R+15. If this is the case, the clock frequency is too high and the adjusting value F is lowered by 1 in a step 27. The clock frequency is thereby adjusted at a value which is approximately 200 kHz lower. If the clock frequency is not too high, it is tested in a step 26 whether the counting value C is smaller than R−15. If this is the case, the clock frequency is too low and the adjusting value F is raised by 1 in a step 28. The clock frequency is thereby raised by approximately 200 kHz. If the counting value C has a value between said two limits, the adjusting value is not adapted. The control program subsequently returns to step 22 in order to perform steps 22-28 again.

In the control program shown in FIG. 5 the program loop comprising steps 22-28 is traversed whenever an interrupt request occurs, i.e. at every flyback period. This has the advantage that the frequency is adjusted rapidly. Successively traversing all possible 64 adjusting values even takes no more than 4 msec. However, such a high speed is not necessary in the assumed application as a clock signal generator for a character generator in a television receiver. It is therefore sensible to perform the steps of said program loop once per television frame or field. The control program can then be accommodated in the conventional microprocessor for controlling functions such as tuning, picture and sound control, and the like.

FIG. 6A shows by way of example how the clock frequency is adjusted as a function of time by means of the control program shown in FIG. 5. In this example the adjusting value is ultimately F=18 at which the clock frequency is 7.76 MHz which corresponds to a counting value of C=466. FIG. 6B illustrates that the clock frequency is automatically corrected if it has increased, for example, due to temperature effects in the start-stop oscillator. An increase to 8.25 MHz (C=495) is permitted, and subsequently the control program lowers the adjusting value by 1 to F=17. The clock frequency corresponding thereto is 8.05 MHz and falls within the fixed limits again.

Figure 7:
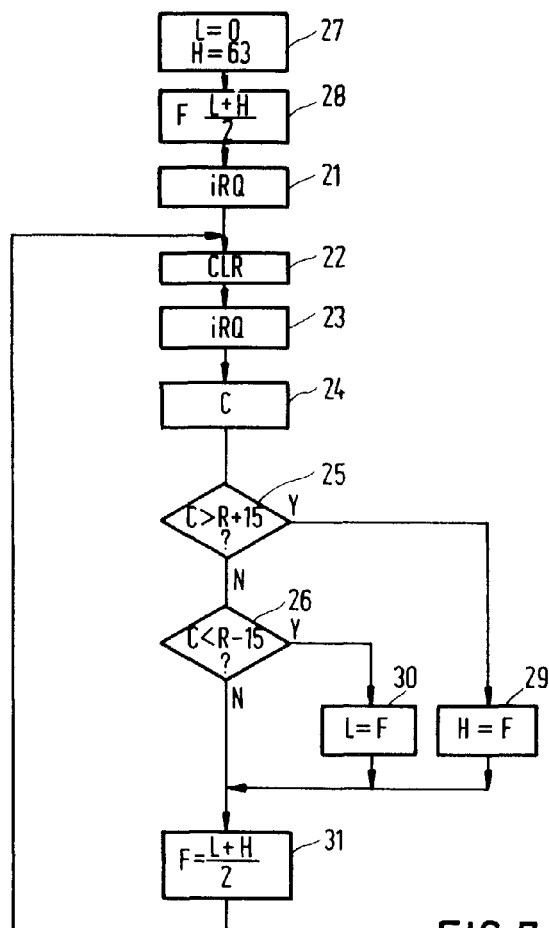
FIG. 7 shows the flow chart of another control program for use in the clock signal generator shown in FIG. 1.
Figure 8:
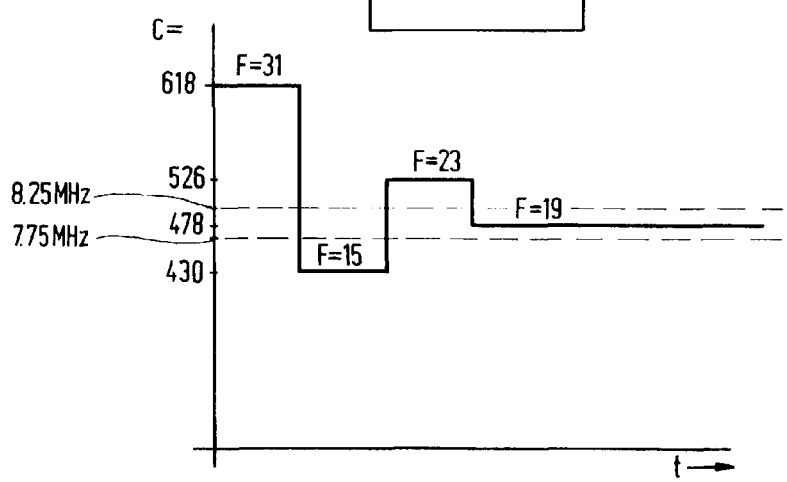
FIG. 8 shows a time diagram to explain the operation of the control program shown in FIG. 7.

A further embodiment of the control program is shown in FIG. 7. In this Figure the steps 21-26 are fully identical to the steps having the corresponding numerals in FIG. 5. The adjusting value is now obtained by a successive halving of an interval of adjusting values. In a step 27 an initial value 0 is assigned to a lower limit L of the interval and an initial value 63 is assigned to an upper limit H. Subsequently a value halfway the interval is assigned to the adjusting value F in a step 28 by means of the operation F=(L+H)/2. If this adjusting value is too large, a new interval is determined in a step 29 by rendering the upper limit H equal to the adjusting value. The lower limit remains unchanged in this case. If the adjusting value is too small, a new interval is determined in a step 30 by rendering the lower limit L equal to the adjusting value. In this case the upper limit remains unchanged. Subsequently a following adjusting value halfway the new interval is determined in a step 31. FIG. 8 shows an example of the clock frequency generated as a function of time by this embodiment. In this example the adjusting value F=19 is ultimately reached, which corresponds to a clock frequency of 7.97 MHz.

On an average, the desired clock frequency is reached faster with the control program shown in FIG. 7 than with the control program shown in FIG. 5. However, if the clock frequency varies, for example due to temperature effects, it generally takes more iterations to reach the new adjusting value. At each iteration, the clock frequency varies shockwise, which causes unpleasant effects on the display screen when using a character generator. It is therefore sensible to use the control program shown in FIG. 7 only for adjusting the clock frequency when the television receiver is switched on and when changing stations (i.e. when the line flyback signal is disturbed temporarily) and subsequently to use the control program shown in FIG. 5 for further monitoring the adjusted clock frequency.

Figure 9:
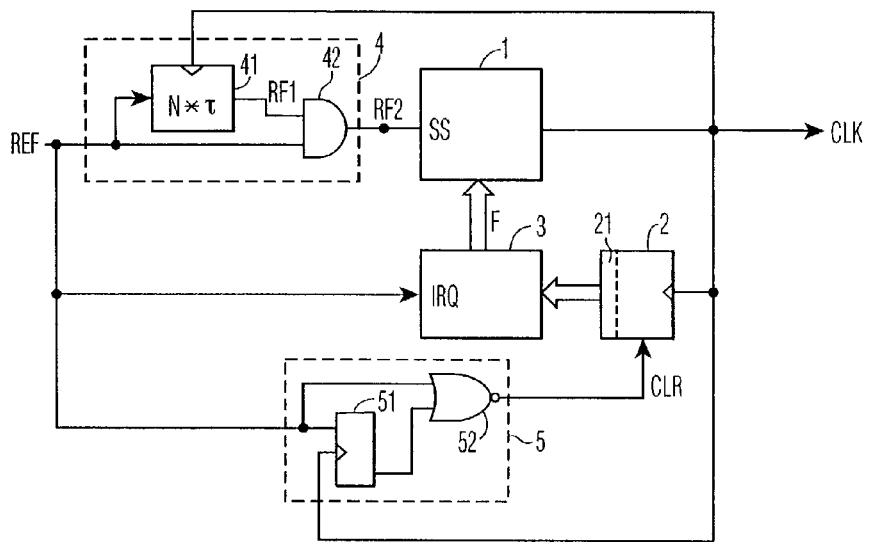
FIG. 9 shows diagrammatically a further implementation of the clock signal generator shown in FIG. 1.
Figure 10A:
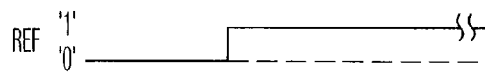
FIG. 10 shows signal waveforms of some signals shown in FIG. 9.
Figure 10B:
Figure 10C:
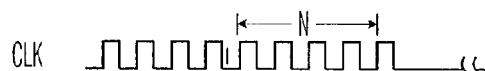
Figure 10D:
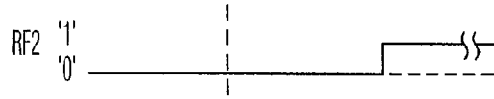

It may be noted with respect to the clock signal generator shown in FIG. 1 that clock signals are not generated during the flyback period of the line flyback signal. In some cases it may be a drawback that this period is relatively long. FIG. 9 shows a further implementation of the clock signal generator with which the clock signal generation is continued for a predetermined period at the start of the flyback period. To this end the clock signal generator is provided with a delay circuit 4 with which the start of the flyback period is delayed a predetermined number of clock pulses N. Its operation is explained with reference to some signal waveforms shown in FIG. 10. The line flyback signal REF (FIG. 10A) is applied to a delay element 41 and to a first input of an AND gate 42. The output signal RF1 of the delay element 41 (FIG. 10B) is applied to a second input of the AND gate 42. After the occurrence of the logic value "1" at the input of the delay element 41, its output signal RF1 maintains the logic value "0" for N clock pulses. The output signal RF2 of AND gate 42 (FIG. 10D) has the logic value "0" during this period so that start-stop oscillator 1 actually continues to generate the clock signal (FIG. 10C). After N clock pulses the output signal RF1 of the delay element acquires the logic value "1". The output signal RF2 of AND gate 42 then also acquires the logic value "1" so that the start-stop oscillator 1 no longer generates a clock signal. At the start of a new display period the line flyback signal REF assumes the logic value "0". This value is applied without any delay to the start-stop oscillator 1 by AND gate 42 so that clock signals are generated again. The delay element 41 can be realised by means of conventional counter means, for example an N-bit shift register.

Figure 10E:
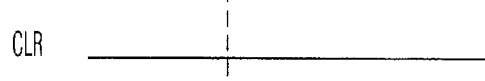

When using the delay circuit 4, the period in which the counter does not receive clock pulses (RF2="1" in FIG. 10D) has become shorter. It may then be necessary to relieve the control program from the task of reading the counting value within this period and of resetting the counter 2. To this end the clock signal generator shown in FIG. 9 has a reset circuit 5. This circuit comprises a flipflop 51 and an inverting OR gate 52 with which the reset signal CLR shown in FIG. 10E is generated. The counter 2 also comprises an output register 21 in which the counting value which has been reached is clocked in by the reset signal CLR. The control circuit 3 can now read the counting value at any arbitrary instant. It is to be noted that the counting value stored in the output register 21 is now C+N. This can be taken into account in the control program.

Finally it is to be noted that the counting value C may be obtained in another manner. For example, it is possible to have a first counter, which receives the clock signal from the start-stop oscillator, count a predetermined number of clock pulses. Thus, this first counter generates a time interval whose duration is determined by the clock frequency. The duration of said time interval is subsequently measured by a second counter by means of a further clock signal having a known frequency. Such a further clock signal is, for example, a crystal-controlled clock signal, which is already available for driving the microprocessor.

Figure 11:
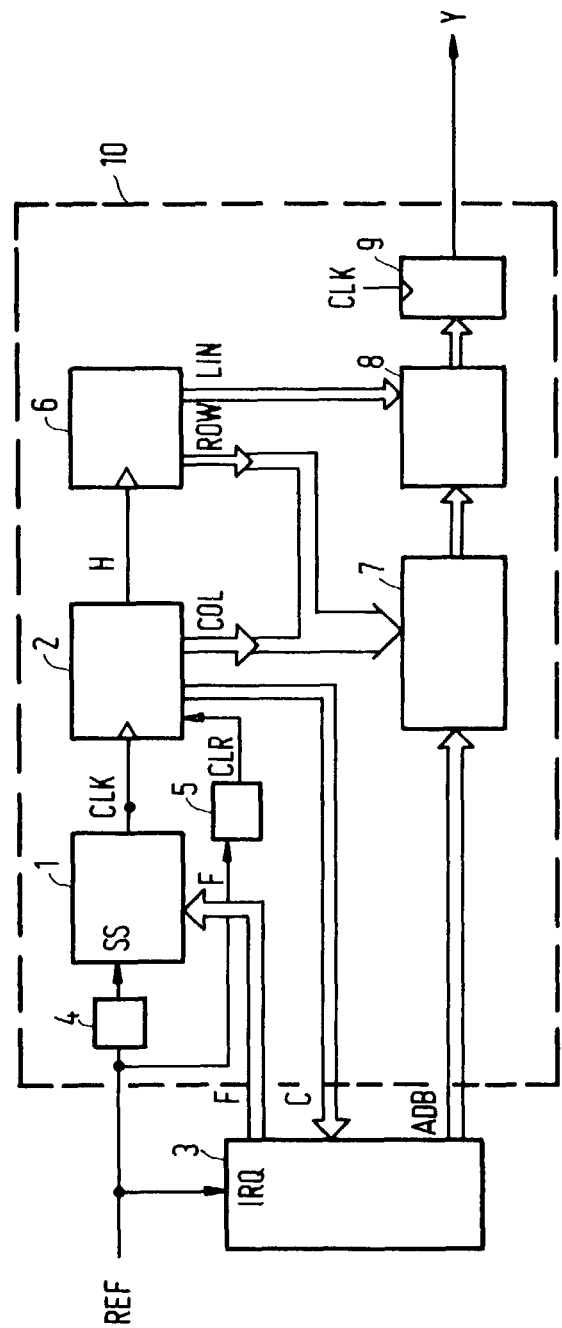
FIG. 11 shows a character generator in which the clock signal generator of FIG. 9 is used.

It has already been stated in the foregoing that the clock signal generator according to the invention is eminently suitable for integration with a character generator for On Screen Display (OSD) of operating information on the display screen of a television receiver. FIG. 11 shows an embodiment of such a character generator according to the invention. The character generator 10 comprises the start-stop oscillator 1 which generates the clock signal CLK for the counter 2. The counter 2 is now not only adapted to generate the counting value C but also to generate a column number COL indicating the horizontal position of the characters to be displayed. Moreover, the counter 2 supplies a line pulse H to a line and row counter 6. In response thereto, line and row counter 6 generates a row number ROW indicating the vertical position of the characters to be displayed, and a line number LIN corresponding to the picture line to be displayed within the row determined by row number ROW. The column number COL and the row number ROW constitute an address which is applied to a display memory (RAM) 7 in which a character code is stored for the characters to be displayed. The character code addressed by the column number COL and the row number ROW is applied to a character memory (ROM) 8 which comprises a matrix composed of pixels for each character. The character memory 8 further receives the line number LIN and generates the pixels for each character which must be displayed in the line with line number LIN. In a parallel-series converter 9 the pixels obtained are successively applied as a pixel signal Y to an output for display on a display screen.

FIG. 11 also shows a microprocessor 3. This processor forms part of a television receiver and is adapted in a manner not further shown to control picture and sound functions as well as to tune to stations. The microprocessor is also connected by means of an address and data bus ADB to display memory 7 of the character generator 10 in order to store the character codes of characters to be displayed in this memory. Moreover, the microprocessor 3 performs the control program required for adjusting the clock frequency. To this end the microprocessor 3 is adapted to receive the counting value C of counter 2 and to apply the adjusting value F to start-stop oscillator 1. An "interrupt request" input IRQ of the microprocessor also receives the line flyback signal REF from a deflection circuit (not shown) in the television receiver. It is to be noted that it is possible to form the connections, shown in FIG. 11, between microprocessor 3 and character generator 10 in a conventional manner as a single bidirectional bus connection. It has also appeared to be possible to integrate the character generator 10 within the housing of microprocessor 3.

The invention claimed is:
1. A phase-coupled clock signal generator comprising:
a start-stop oscillator having an input for receiving a control signal to allow oscillation in response to a first value of the control signal and no oscillation in response to a second value of the control signal, characterized in that the start-stop oscillator is of a type whose generated frequency is adjustable by means of an applied adjusting value and in that the clock signal generator comprises control means for adapting the adjusting value in response to a difference between the generated frequency and a predetermined desired frequency;
wherein the start-stop oscillator includes:
a capacitor;
a current source for charging the capacitor, in which the value of the current corresponds to the applied adjusting value;
a discharge circuit for discharging the capacitor;

a threshold circuit for switching on the discharge circuit in response to reaching a predetermined first voltage across the capacitor and for switching off the discharge circuit in response to a second voltage across the capacitor, and a stop circuit for switching on the discharge circuit in response to the second value of the applied reference signal.

2. A character generator for generating characters on a display screen, comprising:

an input for receiving a reference signal; and a start/stop oscillator to which the reference signal is applied and which is adapted to oscillate in response to a first value of the reference signal and to refrain from oscillation in response to a second value of the reference signal, the start/stop oscillator being of a type whose frequency is adjustable by means of an adjusting value; and control means for adapting the adjusting value if the oscillator frequency lacks a value between two predetermined limits;

wherein the start-stop oscillator includes:

a capacitor;

a current source for charging the capacitor, in which the value of the current corresponds to the applied adjusting value;

a discharge circuit for discharging the capacitor;

a threshold circuit for switching on the discharge circuit in response to reaching a predetermined first voltage across the capacitor and for switching off the discharge circuit in response to a second voltage across the capacitor, and a stop circuit for switching on the discharge circuit in response to the second value of the applied reference signal.

3. The character generator of claim 2, wherein the control means include:

means for counting clock pulses of the oscillator during the period when the first value of the reference signal is available and for generating a counting value corresponding thereto;

means for comparing said counting value with a reference value which corresponds to a desired frequency; and;

means for adapting the adjusting value if the difference between the counting value and the reference value exceeds a predetermined value.

4. The character generator of claim 2, further comprising a horizontal position counter to which the oscillator frequency is applied, wherein the horizontal position counter generates said counting value and positions pixels of characters to be displayed in a picture line.

5. The character generator of claim 2, wherein the reference signal is applied to the start/stop oscillator via delay means adapted to delay transition from the first to the second value of the reference signal.

\* \* \* \* \*